ated tuning capacitor. The master oscillator works into a frequency divider of fixed step-down ratio m:1 (or 2m:1) to produce a reference frequency $f_B$. A slave oscillator, generating an output frequency $f_A = gf_B$, is controlled by a phase-locking loop including a phase comparator to which the reference frequency $f_B$ is fed along with a like frequency obtained from output frequency $f_A$ with the aid of another divider having a digitally variable integral step-down ratio $g:1$. A fractional value $i$, which may range from 0 to 100%, is set with the aid of a numerical interpolation selector to determine the number $n<m$ of cycles of operating frequency $f_Q$ within a cycle (or half-cycle) of reference frequency $f_B$ during which that operating frequency is changed to its lower value $f_Q'$. With a division factor of 2m, alternate half-cycles of reference frequency $f_B$ can be used for stabilizing the frequency $f_Q$ with the aid of another phase-locking loop driven by a standard oscillator. Such a division factor also allows the operating frequency of the master oscillator to be held at its normal value $f_Q''$ throughout the first half of every odd-numbered reference-frequency cycle ($n=0$) and at its reduced value $f_Q'$ throughout the first half of every even-numbered cycle ($n=m$), independently of the setting of the interpolation selector which controls that operating frequency only during the remaining half-cycles ($n=im$); with a switchover from $g$ to $g+1$ during each even-numbered cycle, the parameter $p$ can be adapted to changes in the division factor $g$ by periodically adjusting the tuning capacitor in response to an error signal derived from any variation, between consecutive cycles, in the relative phasing of the two oscillations of reference frequency $f_B$ fed to the phase comparator which controls the slave oscillator.

United States Patent

Hoffmann et al.

[11] 4,020,425
[45] Apr. 26, 1977

[54] DIGITAL SETTABLE FREQUENCY GENERATOR WITH PHASE-LOCKING LOOP

[75] Inventors: Günther Hoffmann; Peter Harzer, both of Eningen, Germany

[73] Assignee: Wandel u. Goltermann KG, Reutlingen, Germany

[22] Filed: Mar. 26, 2976

[21] Appl. No.: 670,714

[30] Foreign Application Priority Data

Mar. 29, 1975  Germany .................. 2513948

[52] U.S. Cl. .................. 331/16; 331/1 R; 331/14; 331/36 C
[51] Int. Cl.² .................. H03B 3/04
[58] Field of Search .............. 331/1 R, 1 A, 10, 14, 331/16, 36 C

[56] References Cited

UNITED STATES PATENTS

| | | | |
|---|---|---|---|
| 3,177,442 | 4/1965 | Halverson | 331/16 |
| 3,311,841 | 3/1967 | Corney et al. | 331/14 |
| 3,441,870 | 4/1969 | Wicker | 331/11 |
| 3,453,542 | 7/1969 | Hoffmann | 324/79 D |
| 3,713,040 | 1/1973 | Page, Jr. | 331/16 |
| 3,864,637 | 2/1975 | Kanow | 331/16 |

Primary Examiner—John Kominski
Attorney, Agent, or Firm—Karl F. Ross; Herbert Dubno

[57] ABSTRACT

A digitally settable frequency generator comprises a master oscillator whose operating frequency $f_Q$ is variable between a normal value $f_Q''$ and a slightly lower value $f_Q' = (1-p)f_Q''$ with the aid of a normally discon- 13 Claims, 6 Drawing Figures

DIGITAL SETTABLE FREQUENCY GENERATOR WITH PHASE-LOCKING LOOP

FIELD OF THE INVENTION

Our present invention relates to a digitally settable frequency generator to be used, for example, in a frequency synthesizer or in a denominational switching stage of the general type described in commonly owned U.S. Pat. No. 3,453,542.

BACKGROUND OF THE INVENTION

It is known, e.g. from that commonly owned prior patent or from U.S. Pat. No. 3,441,870, to adjust the output frequency $f_A$ of a slave oscillator with the aid of a phase-locking loop driven by a reference frequency $f_B$, the magnitude $f_A = gf_B$ of that output frequency being variable in digital increments by means of a settable frequency divider of integral step-down ratio $g : 1$ in the loop. The frequency increments available in such a system are equal to the reference frequency $f_B$ or multiples thereof.

For various reasons, such as greater susceptibility to noise interference and more sluggish response to adjusting operations, practical lower limits exist for the choice of the reference frequency $f_B$; thus, the output frequency $f_A$ can be varied only in relatively coarse steps. Fractional increments can be obtained, as described in U.S. Pat. No. 3,441,870, by varying the division factor $g$ of the divider in different cycles of the reference frequency $f_B$ and averaging the resulting values of output frequency $f_A$ with the aid of a smoothing circuit designed to minimize distortions due to the periodic switchover. This smoothing circuit becomes more effective with an increase in its time constant which, however, again retards any adjustment of the system.

OBJECTS OF THE INVENTION

The general object of our present invention, therefore, is to provide an improved high-resolution frequency generator of the character set forth which avoids the drawbacks of prior systems and is less complex than the one described in commonly owned U.S. Pat. No. 3,453,542.

A more particular object is to provide means in such a frequency generator for preventing drifts in its reference frequency.

It is also an object of our invention to provide, in such a frequency generator, an interpolating selector which can be graduated in units of, say, 0 to 100% giving a direct fractional reading.

SUMMARY OF THE INVENTION

In accordance with our present invention, a variable reference frequency $f_B$ is produced by a tunable master oscillator working into a fixed first frequency divider with an integral step-down ratio $m$, the master oscillator having an operating frequency $f_Q = smf_B$ where $m$ and $s$ are integers with $s$ equal to either 1 or 2. An integral selector connected to a settable second frequency divider in the phase-locking loop of the continuously adjustable slave oscillator serves to vary the output frequency $f_A$ in steps equal to $f_B$, as in the conventional systems, by changing the division factor $g$ thereof; an interpolating selector is connected to the tuning means of the master oscillator for varying the output frequency $f_A$ in fractional increments by changing the operating frequency $f_Q$ between a plurality of different values within every cycle of reference frequency $f_B$.

Thus, during steady-state operation, the length of a cycle of reference frequencies $f_B$ remains constant. If the two oscillations of substantially identical frequencies $f_B$ and $f_A/g$ delivered to a phase comparator in the phase-locking loop are square waves, as will usually be the case, the phase comparator will deliver a steady control signal to the slave oscillator if the leading edge of only one half-cycle of each square wave is used for the comparison. The output oscillation of frequency $f_A$ will therefore be free from objectionable distortions.

In accordance with a more particular feature of our invention, the master oscillator is switchable between two positions respectively corresponding to a value $f_Q'$ and $f_Q''$ for the operating frequency $f_Q$, these values bearing the relationship $1 - f_Q'/f_Q'' = p << 1$. The switchover between these two tuning positions is so carried out, in response to the fractional increments chosen with the aid of the interpolating selector, that one of these positions is maintained during $n < m$ cycles and the other position is maintained during the remaining $m - n$ cycles of frequency $f_Q$ occurring during one half-cycle or one full cycle of frequency $f_B$, depending on whether $s = 2$ or $s = 1$. If the lower operating frequency $f_Q'$ is generated during the $n$ cycles, the output frequency $f_A$ will have a magnitude equal to $f_Q''(g-i)/m$ where $i$ is the selected fractional increment. We may also, however, establish the lower value $f_Q'$ as the normal operating frequency of the master oscillator so that $f_A = f_Q'(g+i)/m$.

Particularly if the master oscillator is crystal-controlled, a reduction of its operating frequency from $f_Q''$ to $f_Q'$ can be achieved with the aid of one or more tuning capacitors connectable by the switchover means across its frequency-determining crystal. For extremely fine tuning and a correspondingly high degree of resolution, tuning capacitors of different magnitudes may be independently controlled by the switchover means in response to different denominational orders (e.g. decades) of the selected fractional increment $i$. In that event, of course, the magnitudes of operating frequency $f_Q$ will be jointly determined by all the tuning capacitors connected in circuit so that $f_Q'$ and $f_Q''$ may not remain exactly constant during the $n$ and $m-n$ cycles in which the highest-ranking tuning capacitor is connected in or disconnected from the tank circuit of the master oscillator.

The choice of a factor $s = 2$ has the advantage of making available, during each cycle of reference frequency $f_B$, a half-cycle which need not be used for establishing the desired fractional increment $i$ but may be utilized for other purposes, e.g. a periodic recalibration of the master oscillator or a readjustment of a tuning reactance to maintain the correct value of $p$. Such a readjustment, based upon a comparison of phase relationships in different reference-frequency cycles in which the selected division factor is switched between $g$ and $g\pm 1$, while $n$ is switched between 0 and $m$ independently of the setting of the interpolation selector, may be used to adapt the parameter $p$ to the selected value of $g$ so that $n = im$ can be selected directly, with elimination of a calculator otherwise needed to compute the value of $n$ from the selector reading $i$. Such a calculator can also be omitted if the switchover between $f_Q''$ and $f_Q'$ is performed many times in the course of a cycle of frequency $f_B$ with the aid of a third frequency divider counting the cycles of output frequency $f_A$.

BRIEF DESCRIPTION OF THE DRAWING

The above and other features of our invention will now be described in detail with reference to the accompanying drawing in which.

SPECIFIC DESCRIPTION

Figure 1:
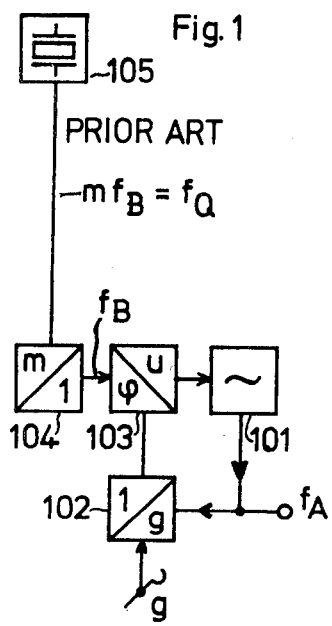
FIG. 1 is a block diagram of a conventional digitally settable frequency generator of the phase-locked type.

The conventional frequency generator shown in FIG. 1 comprises a master oscillator 105 and a slave oscillator 101, the latter delivering an output frequency $f_A$ to a non-illustrated load and also to a manually settable frequency divider 102 of step-down ratio $g:1$ ($g$ being an integer). Divider 102 works into a phase comparator 103 forming part of a control loop for adjusting the oscillator 101 to maintain the output frequency $f_A$ equal to $g$ times a reference frequency $f_B$ delivered to comparator 103 via a fixed frequency divider 104 of step-down ratio $m:1$ driven by master oscillator 105 whose operating frequency has been designated $f_Q$. This system limits the available output frequencies $f_A$ to whole multiples of the invariable reference frequency $f_B$.

Figure 2:
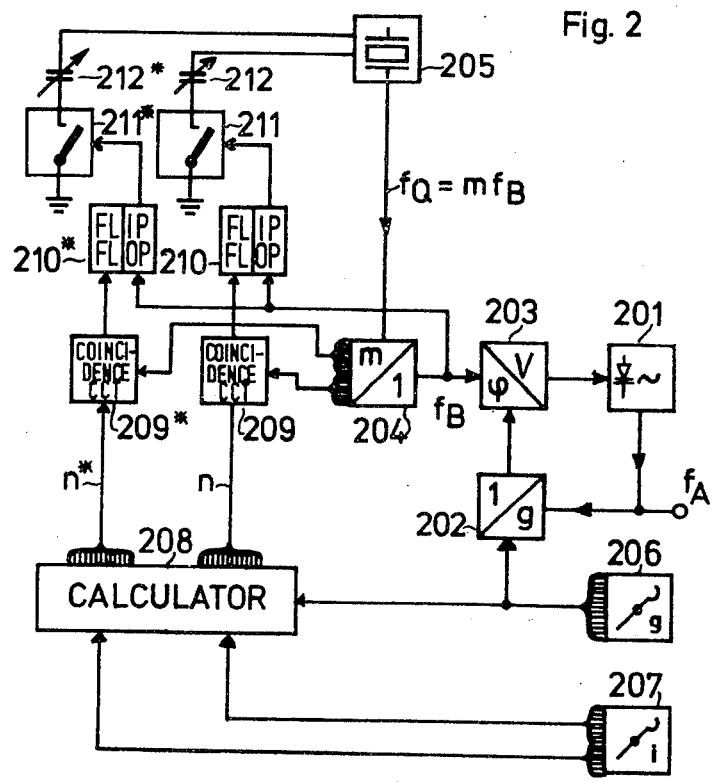
FIGS. 2 – 5 are similar diagrams of different embodiments of our improved frequency generator.

In the embodiments of our invention shown in FIGS. 2 – 5 we have designated corresponding elements by similar reference numerals differing only in their hundreds digits. Thus, FIG. 2 shows a slave oscillator 201 generating the output frequency $f_A$, a frequency divider 202 of variable step-down ratio $g:1$ controlled by a selector 206, a crystal-controlled master oscillator 205 working into a fixed frequency divider 204, and a phase comparator 203 with inputs connected to the two dividers 202 and 204. The operating frequency $f_Q = mf_B$ is variable between a normal value $f_Q'' = mf_B''$ and a slightly reduced value $f_Q' = mf_B'$ with the aid of a shunt capacitor 212 which is connectable across the crystal of oscillator 205 by means of an electronic switch 211. This switch is controlled via a flip-flop 210, in a manner more fully described hereinafter, by a coincidence circuit 209 having two sets of inputs connected by respective wire multiples to corresponding sets of stage outputs of divider 204 and of a calculator 208 controlled by a manual interpolation selector 207. The latter selector serves to adjust the output frequency $f_A$ to some intermediate value $(g-i)f_B''$ between two limiting values $gf_B''$ and $(g-1)f_B''$ established by the setting of selector 206. The fractional increment $i$ may assume any of a multiplicity of discrete magnitudes ranging from 0 to 100%. Thus, for example, selector 207 may be graduated in units of $-0.01\,fB''$ to provide 99 intermediate steps; calculator 08 translates the reading $i$ of this selector into a whole number $n < m$ fed to coincidence circuit 209 for generating an output signal whenever the cycle count of frequency divider 204, designed as a binary pulse counter, matches the calculated threshold $n$. This output signal resets the flip-flop 210 which is set at the beginning of each cycle of reference frequency $f_B$ and in that state closes the switch 211 to reduce the operating frequency of oscillator 205 from $f_Q''$ to $f_Q'$. With selector 207 adjusted to $i = 0\%$, flip-flop 210 cannot be set and oscillator 205 emits its normal operating frequency $f_Q''$; with $i = 100\%$, threshold $n$ has a value designed to maintain the reduced operating frequency $f_Q'$ for a sufficiently long part of a cycle of reference frequency $f_B$ to make the magnitude of the latter frequency, integrated over the entire cycle, equal to $f_Q''(g-1)/mg$. For any intermediate setting of selector 207, therefore, frequency $f_B$ will have a mean value $[f_B]$ corresponding exactly to the $g^{th}$ part of the desired output frequency $$f_A = \frac{f_Q''(g-i)}{m} \text{ whence } [f_B] = \frac{f_Q''(g-i)}{mg}.$$

From the aforestated relationship $p = 1 - f_Q'/f_Q''$, or $f_Q' = (1-p)f_Q''$, it follows that $$\frac{1}{[f_B]} = \frac{n}{f_Q''(1-p)} + \frac{m-n}{f_Q''} = \frac{m(1-p)+np}{f_Q''(1-p)}.$$

With these equations we find the numerical threshold $n$ related to the selected fractional increment $i$ by the equation $$n = \frac{im(1-p)}{p(g-i)} \approx \frac{im}{gp}$$

with $i \ll g$, $p \ll 1$.

A similar relationship can be readily calculated in the event that the capacitor 212 is replaced by a reactance increasing, instead of reducing, the operating frequency of oscillator 205 above its normal value.

FIG. 2 also shows a second frequency-changing capacitor 212* controlled by calculator 208 and frequency divider 204 via a coincidence circuit 209*, a flip-flop 210* and an electronic switch 211* in a manner analogous to that described for capacitor 211. The insertion of capacitor 212* in the tuning circuit of oscillator 205 results in a frequency shift by a ratio which is a small (preferably decadic) fraction of the ratio $(1-p):1$ introduced by the insertion of capacitor 212. Thus, for example, selector 207 may have a principal scale graduated in units of $0.01f_B''$ and, in addition, a vernier scale graduated in units of $0.0001f_B''$ which activates another section of the calculator 208 to compute a correspondingly reduced threshold $n*$ fed to the coincidence circuit 209*. This subdivision obviates the need for the use of a very large division factor $m$.

Figure 3:
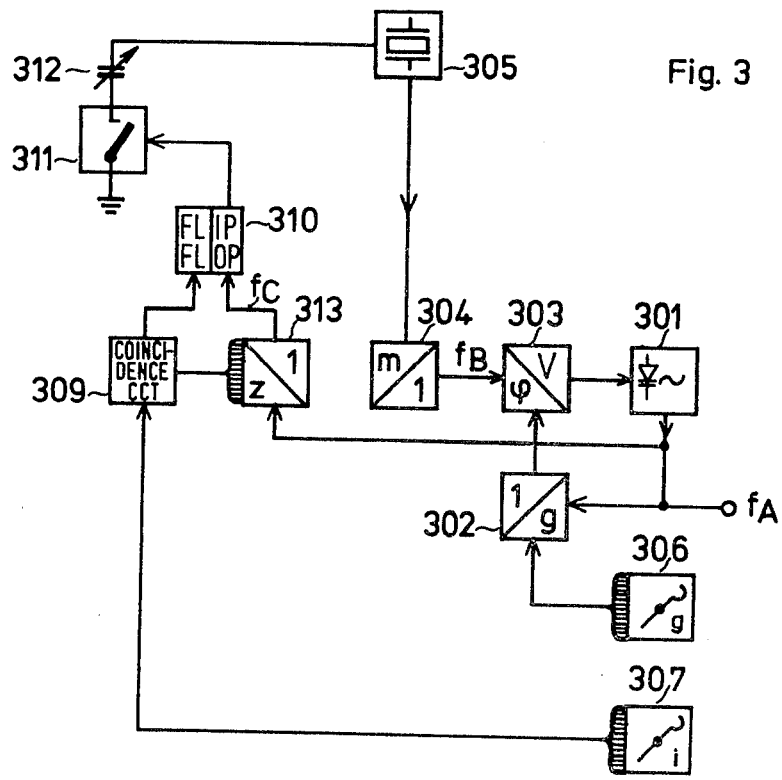

The system shown in FIG. 3 differs from that of FIG. 2 in that the flip-flop 310 controlling the switch 311 is settable by a further frequency divider 313 of fixed step-down ratio $z:1$ driven by the output frequency $f_A$; the coincidence circuit 309, serving to reset that flip-flop, is settable directly by selector 307 without intervention of a calculator. The division factor $z$ of divider 313 should be so chosen that, with any setting of divider 302, an ancillary frequency $f_C$ issuing from divider 313 lies between frequencies $f_Q$ and $f_B$ so that its cycle encompasses a substantial number of cycles of operating frequency $f_Q$ but is only a small fraction of a cycle of reference frequency $f_B$. With division factor $z$ given a decadic value such as 10, for example, interpolating selector 307 can be graduated in units of 0.1 through 0.9. Concidence circuit 309 resets the flip-flop 310, which is set at the beginning of every cycle of ancillary frequency $f_X$, whenever the count of cycles of frequency $f_A$ read out from the stage outputs of divider 313 has a proportional value — with reference to the full count $z$ — equal to the selected fractional increment $i$ chosen by means of selector 307. Thus, the count of $n$ cycles of frequency $f_B$ is broken up into a multiplicity of partial counts occurring during respective cycles of frequency $f_C$. Since $f_C$ will be exactly divisible into $f_A$ only for certain values of $g$, this arrangement allows but a limited number of fractional increments to be selected with reasonable accuracy.

Figure 4:
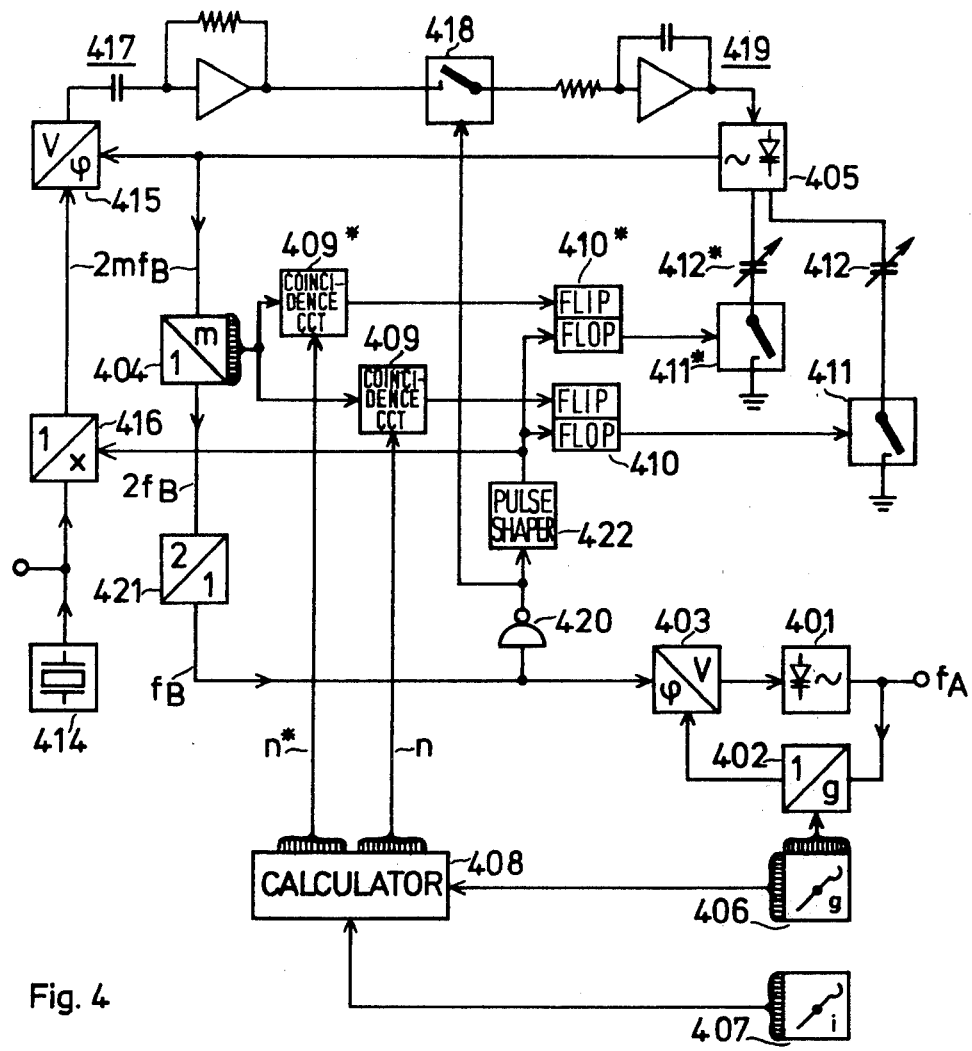

The embodiment of FIG. 4 differs from that of FIG. 2 primarily by the provision of a calibrating circuit for the master oscillator 405, this circuit including a crystal-controlled standard oscillator 414 of great frequency stability. Oscillator 414 may also serve as a source of heterodyning frequencies to be used in a nonillustrated frequency synthesizer connected to the output of oscillator 401. Through a frequency divider 416, of fixed step-down ratio $X:1$, oscillator 414 supplies a frequency $2mf_B$ to a phase comparator 415 in a control loop for master oscillator 405 operating at the same frequency. Phase comparator 415 works into a differentiator 417 connected, through an electronic switch 418, to an integrator 419 which energizes a tuning input of the adjustable oscillator 405; components 417 and 418 include operational amplifiers. Frequency divider 404, having an output frequency $2f_B$, is supplemented by a further binary divider stage 421 stepping that frequency down to the desired value $f_B$ with which the phase comparator 403 is driven. The square wave of reference frequency $f_B$ emitted by divider stage 421 is also fed, through an inverter 420, to the switch 418 and in parallel therewith to a pulse shaper 422 deriving from a rising flank of that square wave a spike which sets the flip-flops 410 and 410* at the beginning of each cycle. With coincidence circuits 409 and 409* receiving the counts $n$ and $n^*$ from divider 404 within the first half-cycle of that square wave, flip-flops 410 and 410* remain reset throughout the second half-cycle. In that second half-cycle the switch 418 is closed to pass to integrator 419 a pulse derived by differentiator 417 from phase comparator 415 at the beginning of this half-cycle, the width of that pulse depending on the relative phasing of the two square waves of frequency $2mf_B$ issuing from divider 416 and oscillator 405. Integrator 419 accumulates these pulses to produce a corrective signal for locking the oscillator 405 in phase with the output of divider 416.

In determining the numerical thresholds $n$ and $n^*$, calculator 408 must take into account the fact that the master oscillator 405 always operates at its normal frequency $f_Q''$ during the second half of each reference cycle.

Figure 5:
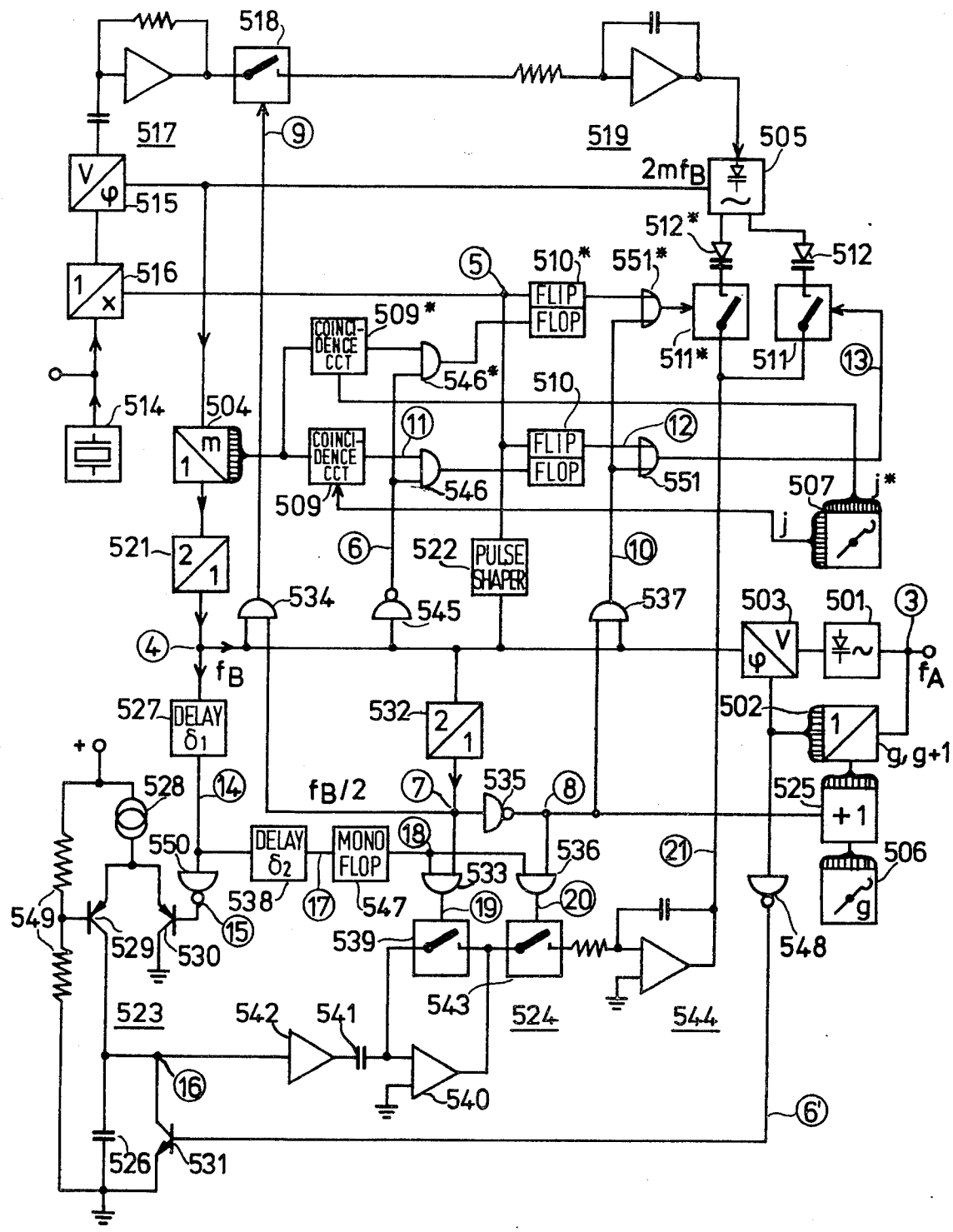
Figure 6:
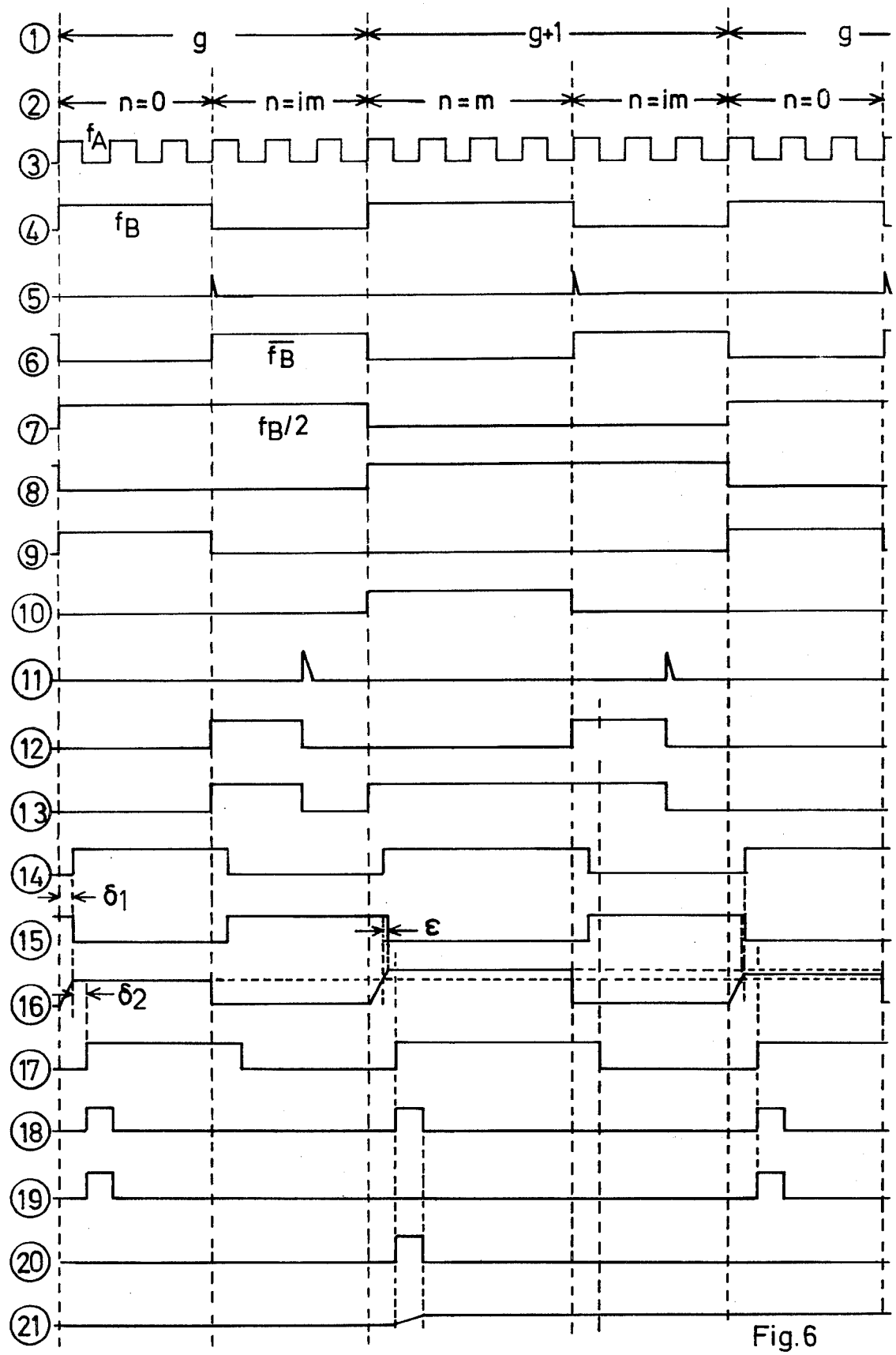
FIG. 6 is a set of graphs relating to the operation of the system of FIG. 5.

In FIG. 5 we have shown another embodiment which combines the features of FIGS. 2 and 4 with a test circuit for eliminating the need for a calculator by automatically modifying the parameter $p$ (and therefore the frequency $f_Q'$) upon a change in the division factor $g$ of divider 502. Certain signals generated in the system of FIG. 5, designated 3 – 21, have been illustrated in the correspondingly numbered graphs of FIG. 6 showing 2½ cycles of reference frequency $f_B$ (graph 4), each of these cycles corresponding to a multiplicity of cycles of output frequency $f_A$ which in this case is equal to $gf_B$ in every odd-numbered cycle and to $(g+1)f_B$ in every even-numbered cycle; see graphs 1 and 2. In the first half of each cycle with division factor $g$, the system operates with a fractional increment $i = 0\%$ ($n = 0$) regardless of the setting of selector 507; in the first half of each cycle of division factor $g+1$, on the other hand, that fractional increment is automatically established at $i = 100\%$ ($n = m$) independently of the position of selector 507. In the second half of every cycle the value of $n = im$ corresponds to the setting of selector 507. Graph 3 shows the output oscillation of frequency $f_A$ which in this instance has been assumed to equal $6f_B$ ($g = 6$).

Elements of FIG. 5 having no counterparts in the earlier Figures include a comparison network 523, designed to detect any difference — from one cycle to the next — in the relative phasing of the two square waves of frequency $f_B$ supplied to phase comparator 503, and an evaluation network 524 deriving from that difference a proportional error signal which is used to modify the reactances of variable capacitors (varactors) 512 and 512*. Network 523 comprises a storage condenser 526 chargeable from a positive supply terminal (+) through a constant-current source 528 by way of a PNP switching transistor 529 paired with another such transistor 530. A voltage divider 549 delivers a constant biasing potential to the base of transistor 529 whereas the base of transistor 530 receives a square wave 15 via a delay network 527 and an inverter 550. Network 527, receiving the square wave 4 of frequency $f_B$ from divider stage 521, delays that wave by a fractional interval $\delta_1$ to produce a signal 14 fed to inverter 550 and, in parallel therewith, to a network 538 introducing an additional delay $\delta_2$ to produce a stepped wave 17 whose leading edge trips a monoflop 547 whereby a short pulse 18 is generated early in each cycle. The latter pulse is fed in parallel to two AND gates 533 and 536 also receiving respective signals 7 and 8 of frequency $f_B/2$ from a further divider stage 532 in cascade with stage 521; signal 8 is derived from signal 7 through an inverter 535. AND gates 533 and 536, which are thus alternately conductive, generate respective pulses 19 and 20 during alternate cycles of reference frequency $f_B$. Signal 19 briefly closes an electronic switch 539 in a feedback circuit of an operational amplifier 540 whose inverting input is connected through a coupling condenser 541 and an amplifier 542 to the junction of transistor 529 with condenser 526 for receiving the charge 16 of that condenser; the latter is periodically short-circuited by an NPN transistor 531 whose base receives a square wave 6' from frequency divider 502 via an inverter 548. Wave 6' (not illustrated in FIG. 6) is virtually identical with a wave 6 derived from wave 4 through an inverter 545 feeding two AND gates 546 and 546* which are inserted between coincidence circuits 509, 509* and the resetting inputs of flip-flops 510 and 510*; these waves 6 and 6' are of practically the same frequency $f_B$ and are relatively offset by a small phase angle $\phi$ detected by comparator 503. Signal 20 briefly closes another electronic switch 543 in the output circuit of operational amplifier 540, that output circuit including an integrator 544 (similar to integrator 519) accumulating an error signal 521 for the readjustment of varactors 512 and 512*.

Signal 7 periodically blocks an AND gate 534 to let only every other positive half-cycle of square wave 4 pass in the form of a signal 9 to switch 518 for closing the calibrating loop of master oscillator 505 during the first half of every odd-numbered cycle in which $n = n^* = 0$. Signal 8 periodically activates an adder 525 which, in the presence of that signal and therefore during every even-numbered cycle of frequency $f_B$, increases the division factor of component 502 from the selected value $g$ to the next-higher value $g + 1$. In the first half of each of these cycles, i.e. during a period corresponding to the first $m$ cycles of the operating frequency of master oscillator 505, an AND gate 537 receiving signals 4 and 8 generates a pulse 10 which is fed by way of two OR gates 551 and 551* to switches 511 (signal 13) and 511* for holding them closed throughout that half-cycle. Thus, oscillator 505 operates on its lower frequency $f_Q'$ (jointly determined by the two varactors 512 and 512*) over that entire half-cycle. This would reduce the output frequency $f_A$ by a unit step, were it not for the fact that the division factor of component 502 has been simultaneously increased to $g+1$ by means of adder 525. In the first half of every other cycle of frequency $f_B$, with adder 525 deactivated, switches 511 and 511* remain open owing to the absence of pulse 10. At the end of the first half of any cycle, a spike 5 from pulse shaper 522 sets the flip-flops 510 and/or 510* (if selector 507 calls for a value $i$ different from zero) to deliver signals as shown at 12 to OR gates 551 and/or 551* for closing switches 511 and/or 511* during part of the next half-cycle. It is only in this second half-cycle, therefore, that the interpolation selector 507 is effective to codetermine the output frequency $f_A$.

At the beginning of any cycle of reference frequency $f_B$, the trailing edge of signal 6' blocks the shunting transistor 531 whereby condenser 526 charges, as indicated in graph 16, until the disappearance of signal 15 after a delay $\delta_1$ cuts off the charging current by driving the transistor 530 into conduction. The charge 16 on condenser 526 is transferred to condenser 541 during the brief period in which interrupter 539 is closed by pulse 19 to complete the feedback circuit of operational amplifier 540 whose output circuit is then opened at interrupter 543 and which therefore grounds the condenser 541 through its negligible input impedance. The charge now stored on condenser 541 is a measure of the constant delay $\delta_1$ and also takes into account the normally small phase difference detected by comparator 503 in 1 cycle. The resulting potential difference across condenser 541 normally balances the next rise in voltage 16, after an intervening discharge of condenser 526 by a pulse 6', during the next-following cycle when interrupter 539 is open and interrupter 543 is briefly closed whereby device 540 operates as a simple amplifier. Any difference between these two consecutive charges, resulting from a phase difference $\epsilon$ as shown in graphs 15 and 16, establishes a new voltage level 21 in the output of integrator 544 controlling the varactors 512 and 512*; phase difference $\epsilon$ will be significant only at the start of operation and upon a change in the setting of selector 506.

In this system the parameter $p$ is to be so related to the selected division factor $g$ that, for any magnitude of this factor, a setting of selector 507 to establish a value of $i = 1$ (100%) yields a count of $n = m$ as the response threshold of coincidence circuits 509 and 509*. As will be apparent from a comparison of the first and third half-cycles of frequency $f_B$ shown in graph 3 of FIG. 6, the lengths of these two half-cycles — each encompassing a succession of $m$ cycles of oscillator 505 — differ from each other by exactly one cycle of output frequency $f_A$ so that $m/f_Q'' = m/f_A = 2m/gf_Q''$ whence, from $f_Q' = (1-p)f_Q''$, we find a relationship $p = 2/(g+2)$ which must be substantially maintained by the test circuit including networks 523 and 524. With $g >> 1$, $p \approx 2/g$.

With a proper choice of division factor $m$, preferably as a decadic number such as 100 or 1000, a fractional increment $i = j+j^*$ can be read directly on the scales of interpolation selector 507 graduated in the aforedescribed manner to give readings $j$ and $j^*$ determining the cycle counts $n = jm$ and $n^* = n^*m$ during the interpolation half-cycles.

We claim:

1. A frequency generator comprising:
    a source of variable reference frequency $f_B$ including an adjustable master oscillator of operating frequency $f_Q = smf_B$, said master oscillator being provided with tuning means, and a fixed first frequency divider with an integral step-down ratio $m:1$ driven by said master oscillator, $s$ being an integer not greater than 2;
    a continuously adjustable slave oscillator provided with a phase-locking loop including a phase comparator;
    a digitally settable second frequency divider with an integral step-down ratio $g:1$ driven by said slave oscillator, said phase comparator having inputs respectively connected to said first and second frequency dividers for receiving therefrom respective oscillations of said reference frequency $f_B$;
    integral selector means connected to said second frequency divider for changing the division factor $g$ thereof to vary the output frequency $f_A = gf_B$ of said slave oscillator; and
    interpolating selector means connected to said tuning means for varying said output frequency $f_A$ in fractional increments by changing said operating frequency $f_Q$ between a plurality of different values within every cycle of said reference frequency $f_B$.

2. A frequency generator as defined in claim 1 wherein said tuning means has a first position establishing a value $f_Q'$ and a second position establishing a value $f_Q''$ for said operating frequency $f_Q$, said values bearing the relationship $1 - f_Q'/f_Q'' = p << 1$, further comprising switchover means responsive to said interpolating selector means and connected to said tuning means for maintaining one of said positions during $n$ cycles and the other of said positions during the remaining $m-n$ cycles of said operating frequency $f_Q$ occurring during at least one half-cycle of said reference frequency $f_B$, $n$ being a whole number less than the division factor $m$ of said first frequency divider.

3. A frequency generator as defined in claim 2 wherein said tuning means comprises at least one capacitor connectable to said master oscillator by said switchover means.

4. A frequency generator as defined in claim 3 wherein said master oscillator is provided with a frequency-determining crystal, said capacitor being connectable by said switchover means across said crystal to lower said operating frequency from $f_Q''$ to $f_Q'$.

5. A frequency generator as defined in claim 2 wherein said tuning means includes adjustable reactance means for establishing a variable off-normal value for said operating frequency $f_Q$ which, over a period equaling $m$ cycles of said operating frequency, changes the length of said period by a cycle of said output frequency $f_A$ in comparison with a like period at a normal value of said operating frequency; further comprising switch means controlled by said first frequency divider for compensatorily incrementing a selected division factor $g$ of said second frequency $\pm 1$ during certain periodically recurring cycles of said reference frequency $f_B$ while controlling said reactance means independently of said interpolating selector means to maintain said off-normal value throughout a series of $m$ cycles of said operating frequency and for keeping said division factor $g$ unincremented during other periodically recurring cycles of said reference frequency $f_B$ while controlling said reactance means independently of said interpolating selector means to maintain said normal value throughout a series of $m$ cycles of said operating frequency, and comparison means for deriving from said phase-locking loop an error signal proportional to any difference in the relative phasing of said oscillations of frequency $f_B$ between said certain cycles and said other cycles, said reactance means being connected to said comparison means for adjustment in a sense tending to minimize said error signal with resulting adaptation of said off-normal value to said division factor $g$.

6. A frequency generator as defined in claim 5 wherein said switch means is operative to increment said selected division factor $g$ during every other cycle of said reference frequency $f_B$; said comparison means comprising:
- a storage condenser with a charging circuit connected to said phase-locking loop, an amplifier with an input circuit connected across said storage condenser, an output circuit including integrating means and a feedback circuit connected between said output and input circuits;
- a coupling condenser between said storage condenser and said input circuit; and
- a pair of interrupters alternately operated by said switch means for opering said output circuit and said feedback circuit during alternate cycles of said reference frequency $f_B$.

7. A frequency generator as defined in claim 5 wherein $s = 2$, said second frequency divider including a final binary stage controlling said switch means for operating and deactivating said switchover means only during single half-cycles of said certain and other cycles of said reference frequency $f_B$ while subjecting said switchover means to the exclusive control of said interpolating selector means during the remaining half-cycles of said certain and other cycles.

8. A frequency generator as defined in claim 2 wherein said tuning means comprises two capacitors of different magnitudes independently connectable to said master oscillator under the control of respective sections of said interpolating selector means.

9. A frequency generator as defined in claim 2 wherein said master oscillator is adjustable, said source further comprising a standard oscillator and calibrating means controlled by said first frequency divider for intermittently connecting said master oscillator in a second phase-locking loop driven by said standard oscillator.

10. A frequency generator as defined in claim 9 wherein $s = 2$, said first frequency divider including a final binary stage controlling said calibrating means for connecting said master oscillator in said second phase-locking loop during alternate half-cycles of said reference frequency $f_B$ with simultaneous deactivation of said switchover means.

11. A frequency generator as defined in claim 2 wherein said switchover means comprises a coincidence circuit connected to receive said whole number $n$ from said interpolating selector means and a count of cycles of said operating frequency $f_A$ from said first frequency divider, and a flip-flop connected to said first frequency divider and to said coincidence circuit for setting at the beginning of at least every other half-cycle of said reference frequency $f_B$ and for resetting upon said count reaching the value of $n$.

12. A frequency generator as defined in claim 11 wherein said interpolating selector means includes a calculator for computing the value of $n$ from a fractional reading $i$ ranging between zero and unity.

13. A frequency generator as defined in claim 2 wherein said switchover means comprises a third frequency divider driven by said slave oscillator to establish an ancillary frequency $f_C$ intermediate said operating and reference frequencies $f_Q$ and $f_B$, a coincidence circuit connected to receive a fractional reading $i$ from said interpolating selector means and a count of cycles of said output frequency $f_A$ from said third frequency divider, and a flip-flop connected to said third frequency divider and to said coincidence circuit for setting at the beginning of every cycle of said ancillary frequency $f_C$ and for resetting upon said count reaching a proportional value equal to said fractional reading $i$.

* * * * *